United States Patent [19]

Chen et al.

[11] Patent Number: 5,679,431
[45] Date of Patent: Oct. 21, 1997

[54] SPUTTERED CARBON OVERCOAT IN A THIN-FILM MEDIUM AND SPUTTERING METHOD

[75] Inventors: Ga-Lane Chen, Fremont; Hoa Van Do, Union City, both of Calif.

[73] Assignee: HMT Technology Corporation, Fremont, Calif.

[21] Appl. No.: 221,875

[22] Filed: Apr. 1, 1994

Related U.S. Application Data

[63] Continuation-in-part of Ser. No. 134,216, Oct. 8, 1993, Pat. No. 5,567,512.

[51] Int. Cl.⁶ .................. G11B 5/66; C23C 14/00
[52] U.S. Cl. .............. 428/65.3; 428/65.5; 428/65.7; 428/336; 428/408; 428/694 T; 428/694 TP; 428/694 TC; 428/695; 428/900; 204/197.12; 204/197.2; 204/298.12; 204/298.13
[58] Field of Search .................. 428/695, 900, 428/408, 556, 657, 65.3, 65.5, 694 T, 694 TD, 694 TC; 204/192.12, 298.12, 192.2, 298.13

[56] References Cited

U.S. PATENT DOCUMENTS

| | | | |
|---|---|---|---|
| 4,272,355 | 6/1981 | Kennedy | 204/298.12 |
| 4,341,816 | 7/1982 | Lauterbach et al. | 427/456 |
| 4,476,141 | 10/1984 | Keller et al. | 514/602 |
| 4,564,435 | 1/1986 | Wickersham | 204/298.12 |
| 4,619,865 | 10/1986 | Keem | 428/333 |
| 4,647,494 | 3/1987 | Meyerson | 428/216 |
| 4,717,622 | 1/1988 | Kurokawa | 428/408 |
| 4,767,517 | 8/1988 | Mioki | 204/192.25 |
| 4,774,130 | 9/1988 | Endo | 428/216 |
| 4,780,354 | 10/1988 | Nakayama | 428/141 |
| 4,804,590 | 2/1989 | Nakamura | 428/408 |
| 4,840,844 | 6/1989 | Futamoto | 428/336 |
| 4,880,687 | 11/1989 | Yokoyama | 428/141 |
| 4,929,514 | 5/1990 | Natarjan | 428/611 |
| 4,932,331 | 6/1990 | Kurihara | 406/286.1 |
| 5,045,165 | 9/1991 | Yamashito | 204/192.16 |
| 5,215,639 | 6/1993 | Boys | 204/192.12 |
| 5,227,211 | 7/1993 | Eltoukhy | 428/65.4 |
| 5,230,462 | 7/1993 | Vascak et al. | 228/222 |
| 5,266,408 | 11/1993 | Schmidt | 428/446 |

*Primary Examiner*—Leszek Kiliman
*Attorney, Agent, or Firm*—Peter J. Dehlinger; Judy M. Mohr

[57] ABSTRACT

A thin-film magnetic recording medium having a carbon overcoat composed of an overcoat sublayer and an overcoat surface layer is described. The overcoat surface layer is a hydrogen- or nitrogen-containing sputtered carbon layer with high wear-resistance. The overcoat sublayer functions to reduce the diffusion of nitrogen or hydrogen from the surface layer to the magnetic recording layer. Also described is a method of sputtering the nitrogen-containing surface layer in which the graphite target is attached to the target electrode by thermally conducting, electrically conducting materials.

12 Claims, 8 Drawing Sheets

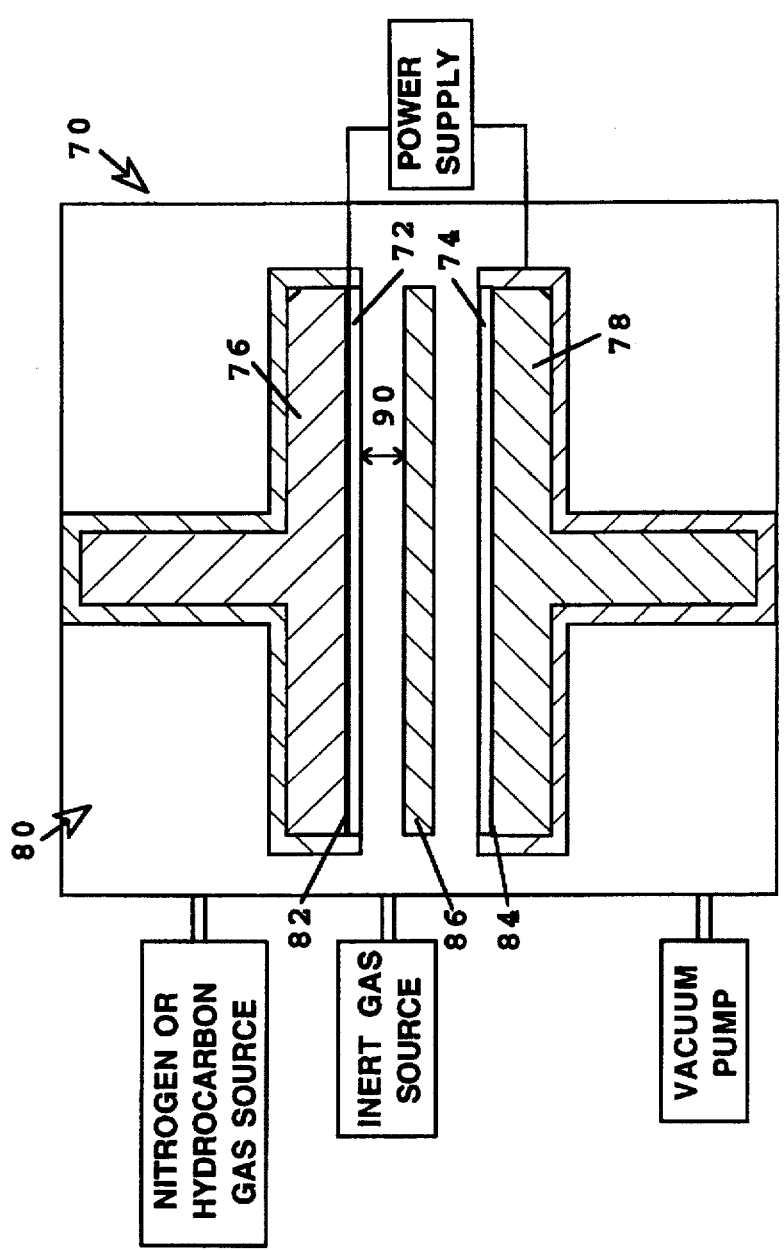
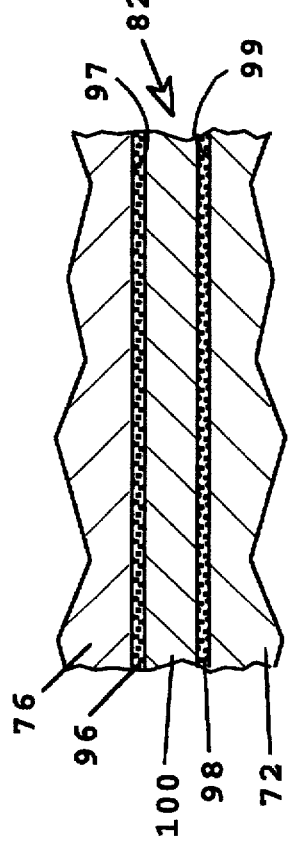
Fig. 4A
Fig. 4B

SPUTTERED CARBON OVERCOAT IN A THIN-FILM MEDIUM AND SPUTTERING METHOD

This application is a continuation-in-part of U.S. patent application for "Thin Carbon Overcoat and Method of Its Making', Ser. No. 08/134,216, filed Oct. 8, 1993, now U.S. Pat. No. 5,567,512.

1. Field of the Invention

The present invention relates to a longitudinal thin-film recording medium having a nitrogen-containing carbon overcoat, and to a method of making the overcoat.

2. References

Bird, J. R., et al., Ion Beams of Material Analysis, Academic Press.

Brundle, C. R., et al., Encyclopedia of Materials Characterization, Butterworth-Heinemann (1992).

Chu, W-K, et al., Backscattering Spectrometry, Academic Press (1978).

3. Background of the Invention

Carbon overcoats are commonly formed in thin-film recording discs and function to protect the underlying magnetic layer from damage and wear. Repeated contact between the disc and the read-write head used in accessing the disc can cause damage and/or wear to the medium. Ideally, the carbon overcoat has a high degree of hardness or erosion-resistance to provide maximum protection against wear.

Additionally, the carbon overcoat provides lubricating surface properties, which minimizes drag on the read/write head and wear on the disc during prolonged head/disc contact. The lubricity of a hard carbon overcoat on a disc may be enhanced by covering the overcoat with a thin liquid layer of a stable fluid lubricant, such as a perfluoropolyether lubricant. The optimum friction reduction may be achieved with a liquid layer of perfluoropolyether of about 15–30 Å or higher.

Typically, thin-film media are prepared by sputtering multiple layers onto a substrate, with the carbon overcoat layer being the last layer that is formed. The carbon overcoat is sputtered from a graphite target onto the thin-film recording disc, usually in a low-pressure argon atmosphere, until an overcoat of the desired thickness is reached.

The resulting carbon overcoat has a predominantly graphitic structure with "islands" of diamond-like crystalline clusters with dimensions on the order of about 20 Å. It is, of course, the diamond-like clusters which impart the hardness properties to the overlayer. Adequate wear resistance can be achieved with an overcoat thickness of between about 200–300 Å.

The parent, co-pending application, "Thin Carbon Overcoat and Method of Its Making', Ser. No. 08/134,216, filed Oct. 8, 1993, now U.S. Pat. No. 5,567,512, describes a nitrogen-containing carbon overcoat produced by sputtering the carbon overcoat under an argon/nitrogen atmosphere. The nitrogen-containing overcoat has an improved wear-resistance that allows the thickness of the overcoat to be reduced to about 80–150 Å, while retaining good wear resistance. The reduced thickness allows the head fly closer to the magnetic film layer in a recording medium, which leads to improved magnetic recording properties, particularly $PW_{50}$, overwrite, and resolution properties.

In continued studies on the properties on thin-film media with nitrogen-containing overcoats, the applicants have discovered that the coercivity of a medium may be reduced over time, an effect that appears to be due to diffusion of nitrogen in the overcoat into the magnetic thin-film layer of the medium. Accordingly, it is desirable to reduce nitrogen diffusion into the magnetic recording layer.

It has also been discovered that sputtering graphite under a nitrogen atmosphere can cause arcing between the substrate and target, a phenomenon which can lead to inhomogeneities and surface defects in the overcoat, and to uneven erosion of the graphite target. It would be desirable, therefore, to carry out the overcoat sputtering in a way that prevents arcing.

4. Summary of the Invention

In one aspect, the invention includes an improvement in a thin-film medium having a substrate, a magnetic thin-film layer, and a sputtered wear-resistant overcoat. The improvement to the overcoat includes (a) a sputtered, non-magnetic, substantially nitrogen-free sublayer having a thickness between 25–100 Å; and (b) a sputtered carbon overcoat surface layer having (i) a surface density of nitrogen atoms between $3-8\times10^{16}$ atoms/cm$^2$, as determined by Rutherford backscattering spectroscopy, and (ii) an erosion rate, as measured by rate of erosion of the overcoat by an $Al_2O_3$ particle tape placed in contact with the medium, that is several times less than that of a carbon overcoat having the same thickness, but formed by sputtering under a pure argon atmosphere. The magnetic recording medium described has a coercivity at least about 15% higher than the same medium in the absence of the sublayer.

The sublayer is a sputtered carbon, chromium or titanium film, preferably having a thickness of between 25–50 Å.

In another aspect, the invention includes an improvement in a method of producing a carbon overcoat in a thin-film magnetic recording medium having a magnetic recording layer, where the overcoat is produced by sputtering a carbon surface layer from a graphite target under an atmosphere composed of 60–80 atomic percent argon and 20–40 atomic percent nitrogen. The improvement includes sputtering a non-magnetic, substantially nitrogen-free sublayer to a thickness between 25–100 Å prior to sputtering the carbon surface layer.

In one embodiment, the sublayer is sputtered from a carbon, chromium, or titanium target material. In a preferred embodiment, the sublayer is sputtered from a graphite target to a thickness between 25–100 Å. The graphite target used in forming the sublayer and surface layer may be bonded to a stainless steel cathode cap by means of (i) electrically conductive, thermally conductive coatings formed on each of the confronting surfaces of the target and cathode cap, and (ii) a solder effective to bond to the coatings and which has a melting temperature above 150° C.

In another aspect, the invention includes a method of forming a sputtered hydrogen or nitrogen containing layer on a disc. The method includes placing the disc in the target-deposition region of a graphite target. The graphite target is bonded to a stainless steel cathode cap by means of (i) electrically conductive, thermally conductive coatings formed on each of the confronting surfaces of the target and cathode cap, and (ii) a solder effective to bond to the coatings and which has a melting temperature above 150° C. The disc is then sputtered under a hydrogen- or nitrogen-containing atmosphere.

These and other objects and features of the invention will be more fully appreciated when the following detailed description of the invention is read in conjunction with the accompanying drawings.

BRIEF DESCRIPTION OF THE DRAWINGS

FIG. 4A is a schematic view of the target electrode and sputtering target assembly in a sputtering station;

FIG. 4B illustrates the method of the present invention of bonding the target to the cathode cap;

DETAILED DESCRIPTION OF THE INVENTION

I. Magnetic Recording Medium with Carbon Overcoat

Figure 1:
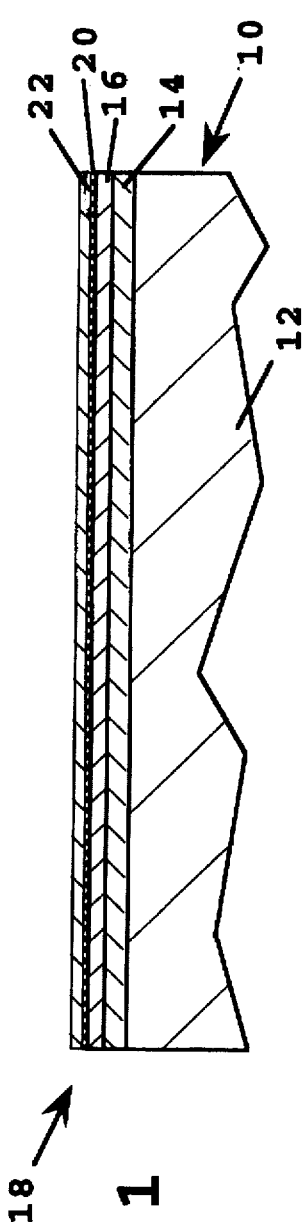
FIG. 1 is a sectional view of a thin-film magnetic disc having a carbon overcoat formed in accordance with the present invention.

FIG. 1 shows in cross section view, a fragmentary portion of a thin-film medium 10 composed of a rigid disk-like substrate 12, and forming successive thin-film layers over the substrate, a crystalline underlayer 14, a magnetic thin-film layer 16, and, formed in accordance with the invention, an overcoat 18 which is composed of a sublayer 20 and a surface layer 22.

The substrate may be a textured substrate, such as a conventional surface-coated, textured aluminum substrate of the type used commonly for digital recording medium, or a textured glass or ceramic substrate.

The crystalline underlayer is preferably a sputtered chromium underlayer having a thickness between about 300–3,000 Å. The magnetic film layer is preferably a cobalt-based alloy, that is an alloy containing at least 50% cobalt, and is formed on the underlayer by sputtering or the like. Exemplary thin-film alloys include binary alloys and ternary alloys, such as Co/Cr, Co/Ni, Co/Cr/Ta, Co/Ni/Pt, or Co/Cr/Ni, and quaternary and five-element alloys, such as Co/Ni/Cr/Pt, Co/Cr/Ta/Pt, Co/Cr/Ta/Pt/B, or Co/Cr/Ni/Pt/B. The underlayer and the magnetic thin-film layer are deposited under sputtering conditions known by those skilled in the art.

The overcoat 18 is composed of a sublayer overcoat 20 and a surface layer overcoat 22. Surface layer overcoat 22 is a nitrogen- or hydrogen-containing carbon film formed by sputtering from a graphite target in a nitrogen- or hydrogen-containing atmosphere, to be described in more detail below.

In a typical magnetic recording medium, the overcoat is deposited over the magnetic recording layer, and over time the nitrogen atoms in a nitrogen-containing overcoat diffuse into the magnetic recording layer. Experiments in support of the invention have shown that nitrogen present in the magnetic recording layer lowers the coercivity of the medium. An additional effect of nitrogen diffusion is the loss of nitrogen from the overcoat surface layer which may lead to a reduction in the improved wear resistance offered by a nitrogen-containing overcoat.

The sublayer 20 in overcoat 18 of the present invention is designed to reduce the nitrogen, or hydrogen, diffusion from the surface layer to the magnetic recording layer. The overcoat sublayer is disposed between the magnetic recording layer 16 and the nitrogen- or hydrogen-containing overcoat surface layer 22. The overcoat sublayer is composed of amorphous carbon, chromium, or titanium and is between 25–100 Å in thickness. As shown below, the sublayer functions to reduce the diffusion of nitrogen into the magnetic recording layer, thereby maintaining media coercivity and tribological behavior.

II. Carbon Overcoat Preparation

A. Sputtering Apparatus

Figure 2:
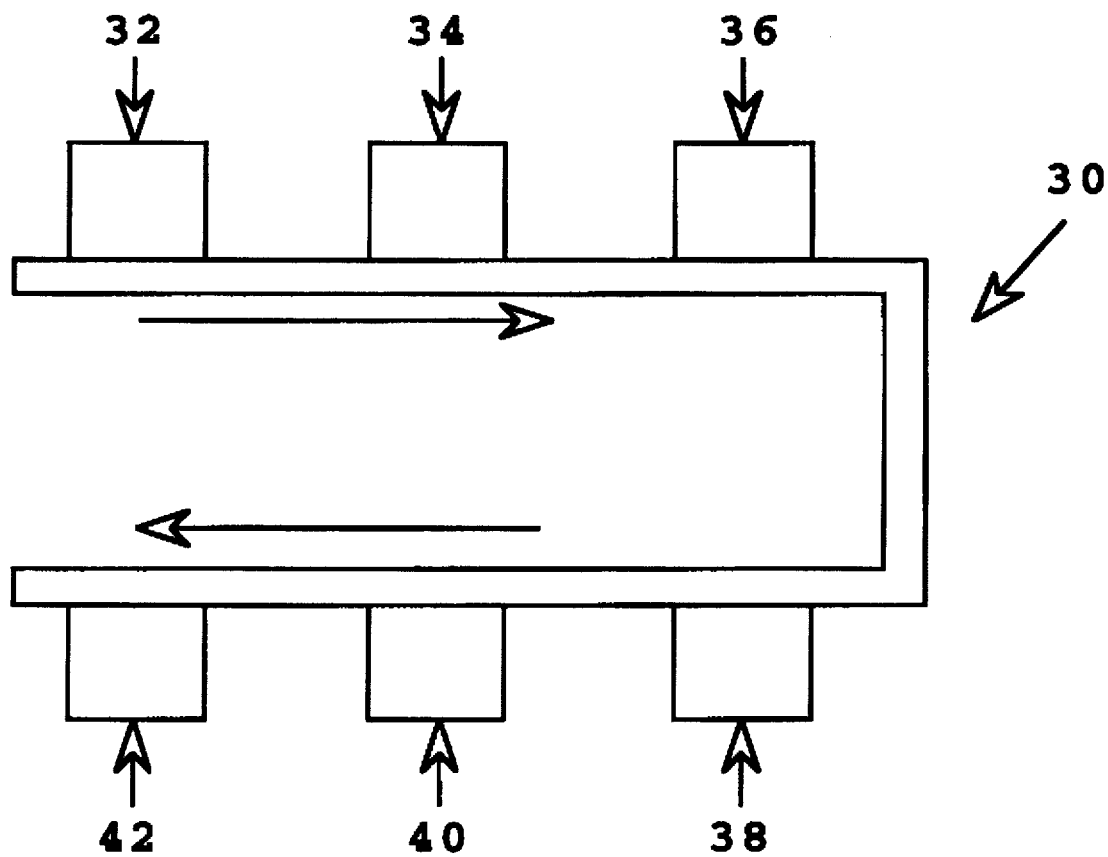
FIG. 2 is a schematic view of a six-station sputtering apparatus used in producing the disc shown in FIG. 1.

FIG. 2 shows schematically a six-station sputtering apparatus 30 for use in forming the longitudinal thin-film medium of FIG. 1. The apparatus includes six chambers, 32, 34, 36, 38, 40, 42 at which heating or sputtering operations occur. Substrates to be heated or sputtered travel through the apparatus supported on a pallet carried on a travelling belt, as will be shown in FIG. 3.

Station 32 in the sputtering apparatus is a heating chamber, where the substrates are heated to a temperature of between about 100°–500° C. Stations 34 and 36 are sputtering chambers where the crystalline underlayer and the magnetic thin-films layer are formed, respectively.

Stations 38, 40, 42 are sputtering chambers, where the overcoat sublayer and surface layer are deposited. The overcoat sublayer is sputtered in chamber 38, which contains a pair of targets for deposition of a carbon, chromium or titanium layer. Sputtering in station 38 is done in an atmosphere that is substantially nitrogen-free. "Substantially nitrogen-free", as used herein, refers to a layer sputtered under an atmosphere which is essentially free of nitrogen. Layers sputtered in a substantially nitrogen-free atmosphere will typically have a nitrogen surface density, as measured by Rutherford Backscattering, of less than $2 \times 10^{16}$ nitrogen atoms/cm$^2$. In operation, station 38 is evacuated to a vacuum of about $10^{-7}$ Torr. Argon, or a similar inert gas, is introduced into the sputtering chamber to a pressure of between about $10^{-3}$ to $10^{-2}$ mTorr.

Figure 3:
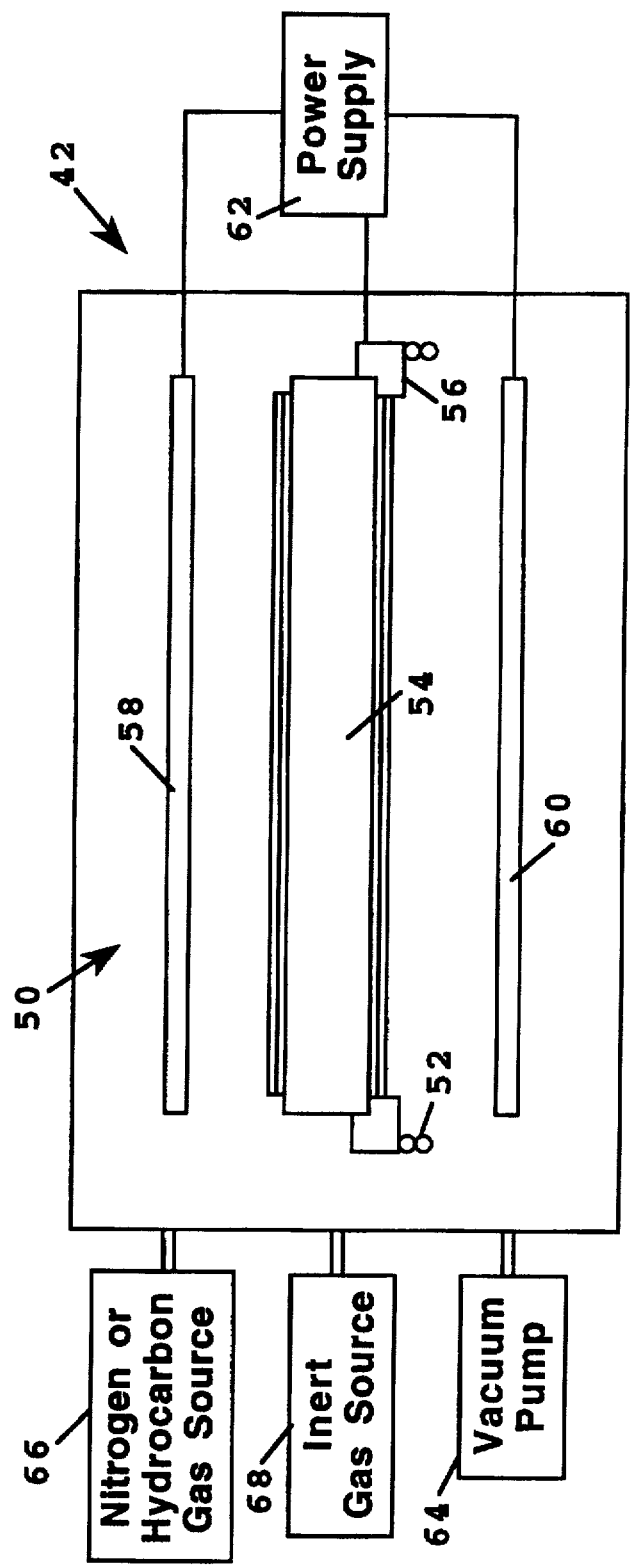
FIG. 3 is an enlarged view of a single sputtering station of the apparatus shown in FIG. 2.

The overcoat surface layer is deposited in stations 40, 42, and FIG. 3 shows, in schematic cross-sectional view, station 42. Station 42 includes a vacuum chamber 50 and within this chamber is a pair of endless belts, such as belt 52, for carrying substrates, such as substrate 54, through the chamber. The substrates are supported on pallets, such as pallet 56, which is carried through the chamber on the endless belts.

Station 42 houses a pair of carbon, i.e., graphite targets 58, 60. The targets are connected to a power supply 62 in the apparatus to achieve a selected target voltage with respect to the disc, as shown. Commercially available graphite targets, such as a POCO™ target supplied by POCO Graphite, Inc. (Decatur, Tex.) are suitable. The carbon sputtering voltage is typically adjustable between about 400 to 600 volts, giving a power level between about 0.8 and 4 kWatts.

The final pressure in the chamber during a sputtering operation is a selected pressure preferably between about $10^{-3}$ to $10^{-2}$ mTorr. The vacuum pressure is achieved with a conventional low-pressure vacuum pump 64.

Sputtering apparatuses are commercially available from various manufacturers, such as Circuits Processing Apparatus (Fremont, Calif.), Leybald Heraeus (Germany), VACTEK (Boulder, Colo.) or Materials Research Corp (Albany, N.Y.). These systems differ in the number of chambers, but are all double-sided, in-line, high-throughput machines having two interlocking chambers for loading and unloading.

The overcoat surface layer of the present invention is formed by sputtering under a low-pressure, nitrogen-containing or hydrogen-containing atmosphere. For formation of a nitrogen-containing surface layer, the sputtering atmosphere contains between 20–40 atomic percent nitrogen gas, i.e., the atoms of $N_2$ introduced into the chamber represent between 20 and 40 atomic percent of the total gas molecules in the chamber. For formation of a hydrogen-containing overcoat surface layer, methane is supplied to the chamber, rather than nitrogen. Typically, the sputtering atmosphere contains about 50 atomic percent methane. In both cases, the balance of gas is an inert sputtering gas, such as argon.

With continued reference to FIG. 3, the nitrogen, methane and argon gases are supplied to the chamber from gas sources, such as a nitrogen gas source 66, and an argon gas source 68. The desired atomic percentages of gases in the chamber may be controlled by suitable valving apparatus (not shown) which controls the flow rate at which gases are introduced into the chamber. Alternatively, the desired gas may be premixed and admitted to the sputtering chamber from a single mixed-gas source.

In the application of the invention to thin-film media, the overcoat sublayer is preferably formed under sputtering conditions which yield a final thickness of between about 25–100 Å. The overcoat surface layer is sputtered to a final thickness of preferably less than about 200 Å, and preferably between about 80–150 Å.

According to an important feature of the invention, it has been discovered that a medium having an overcoat composed of a carbon sublayer formed of amorphous carbon and a nitrogen-containing surface layer has a higher coercivity, higher resolution and lower pulse width than a medium having no overcoat sublayer. Depth profiling shows that the sublayer is effective to reduce the amount of nitrogen that diffuses from the nitrogen-containing surface layer in the overcoat to the magnetic recording layer.

After formation of the overcoat, the disc may be coated with a conventional perfluoropolyether lubricant, such as AN 2001™ lubricant supplied commercially by Ausimont (Morristown, N.J.). The fluid may be applied conventionally by an endless belt tape device designed to burnish and lubricate a finished disc surface. Alternatively, the finished disc may be dipped in a solution of the lubricant in a suitable solvent.

B. Method of Target Bonding

Prior to deposition, the sputtering target is attached or secured to a target electrode, such as a cathode cap, as shown in FIG. 4A. Shown here is a sputtering station 70 having a pair of graphite sputtering targets 72, 74 and two target electrodes, 76, 78 positioned within the vacuum chamber 80. The electrodes are cooled, usually water cooled, with cooling coils (not shown in FIG. 4A).

The sputtering targets are attached to the target electrodes by means of a bonding layer 82, 84. It is important that the bond be secure, as thermal and mechanical stresses generated during the sputtering operation can cause the target to separate from the cathode cap. A secure bond helps to ensure good heat transfer between the target and the cathode cap which is in contact with the cooling source.

As mentioned above, sputtering graphite under a nitrogen or hydrogen atmosphere can cause arcing between the substrate and target, as indicated at 90 in FIG. 4A between substrate 86 and target 72. Arcing can lead to inhomogeneities and surface defects in the overcoat, and to uneven erosion of the graphite target. It has been found that by providing a thermally conducting and electrically conducting bond between the target and the cathode cap, the occurrence of an arc is significantly reduced.

FIG. 4B shows the cathode cap 76 and the sputtering target 72 discussed in FIG. 4A. The bonding layer 82 is a multilayer laminate which is both thermally conductive and electrically conductive. Layer 82 is formed by applying, preferably by sputtering, layers of a thermally conducting, electrically conducting material, seen at 96, 98 in FIG. 4B, onto each of the confronting surfaces 97, 99 of the cathode cap and the sputtering target, respectively.

Layers 96, 98 may be formed of any electrically conducting, thermally conducting material, such as copper, silver, or gold. The layer deposited onto the cathode cap is preferably between 0.2–10 µm, and more preferably between 0.2–1.0 µm. This layer should be thick enough to be mechanically durable and able to withstand replacement of the attached sputtering target. Layer 98, deposited on the sputtering target, is also composed of copper, silver, or gold and is deposited to a similar thickness range.

During the sputtering process, the positive ions extracted from the plasma of the inert gas are accelerated to a high kinetic energy and strike the surface of the sputtering target, where part of the kinetic energy is changed to heat. As a result of this process, the sputtering target can reach temperatures of 300° C., depending on the power input to the system. Generally, a higher power input is desired as this gives a higher deposition rate, however, it also produces more heat. Good heat transfer between the sputtering target and the cathode cap maintains operating temperatures in a range where target cracking and debonding from the target electrode are less likely to occur.

Also during the sputtering process, a charge builds on the surface of the target. During reactive sputtering, as during formation of a nitrogen-containing or hydrogen-containing carbon overcoat, an electric arc between the target and the substrate can occur. If the bond between the target and the cathode cap is electrically conducting, electrons are drawn away from the surface of the target and the occurrence of an arc is reduced.

Referring again to FIG. 4B, the coated surfaces of the target and the cathode cap are joined with a solder layer 100 that is effective to bond to each of the electrically conducting, thermally conducting coatings. The solder is selected to withstand the highest temperature reached by the target during the sputtering process. Solders with a melting temperature of greater than about 150° C. and which are thermally conducting and electrically conducting are preferred. Exemplary solders include indium, indium/tin, tin/aluminum, or lead/tin.

IV. Media Properties

Magnetic recording media were formed, in accordance with the invention, on a rigid substrate and with a chromium underlayer and a cobalt-based magnetic recording layer. An overcoat sublayer of carbon was formed prior to deposition of a nitrogen- or hydrogen-containing overcoat surface layer. The media were analyzed by (i) characterizing the surface atom density of nitrogen in the overcoat surface layer, (ii) measuring the resistance to erosion of the overcoat surface layer, (iii) Auger depth profiling of the overcoat surface layer and sublayer in media formed with and without an overcoat sublayer, (iv) measuring the recording properties, and (v) contact-start-stop tests.

(i) Surface Atom Densities

Rutherford Backscattering (RBS) and Elastic Recoiled Detection (ERD) were used to calculate surface atomic densities of carbon, hydrogen, and nitrogen, according to known procedures (Bird, Brindle, Chu). The studies were carried out on carbon films formed on a Canasite™ sample, in order to avoid overlapping of the signal due to Ni and other metals. The values of carbon and nitrogen were calculated from the simulated fitting to measured RBS spectra. The composition was determined for a carbon film formed by sputtering in an 80% argon/20% nitrogen atmosphere, to the film thicknesses indicated. Table 1 shows the actual measured atom density and, in parenthesis, the atom density normalized to a film thickness of 330 Å.

TABLE 1

SURFACE DENSITY OF CARBON, HYDROGEN AND NITROGEN IN MEDIA FORMED UNDER VARIOUS NITROGEN-CONTAINING ATMOSPHERES

| $N_2$ Content (%) | C (atoms/cm$^2$) | H (atoms/cm$^2$) | N (atoms/cm$^2$) | Thickness (Å) |
|---|---|---|---|---|
| 0 | $3.9 \times 10^{17}$ | $4.57 \times 10^{16}$ | $1.5 \times 10^{16}$ | 330 |
|  | $(3.9 \times 10^{17})$ | $(4.57 \times 10^{16})$ | $(1.5 \times 10^{16})$ |  |
| 20 | $3.9 \times 10^{17}$ | $3.96 \times 10^{16}$ | $3.5 \times 10^{16}$ | 350 |
|  | $(3.9 \times 10^{17})$ | $(3.96 \times 10^{16})$ | $(3.5 \times 10^{16})$ |  |
| 40 | $3.9 \times 10^{17}$ | $3.18 \times 10^{16}$ | $7.5 \times 10^{16}$ | 420 |
|  | $(3.9 \times 10^{17})$ | $(2.99 \times 10^{16})$ | $(7.1 \times 10^{16})$ |  |
| 60 | $4.2 \times 10^{17}$ | $2.65 \times 10^{16}$ | $1.0 \times 10^{17}$ | 420 |
|  | $(3.3 \times 10^{17})$ | $(2.08 \times 10^{16})$ | $(7.9 \times 10^{16})$ |  |
| 75 | $4.6 \times 10^{17}$ | $3.41 \times 10^{16}$ | $1.7 \times 10^{17}$ | 450 |
|  | $(3.6 \times 10^{17})$ | $(2.50 \times 10^{16})$ | $(1.2 \times 10^{17})$ |  |

The data shows that the surface density of nitrogen atoms in the film increases with increasing percent nitrogen gas used in forming the layer. In the range 20–40 atomic percent nitrogen, the surface density of nitrogen is about $3-8 \times 10^{16}$ atoms/cm$^3$, the preferred surface density of nitrogen atoms in the invention.

(ii) Resistance to Erosion

The resistance to erosion was measured by a Selket 100 erosion tester (San Jose, Calif.). The device has a 1 inch diameter steel ball which is applied to a tape roller (coated with aluminum oxide particles), to apply an erosion pressure on the roller. One preferred abrasive surface is a 0.3μ particle size abrasive tape, such as tape No. 511904569 supplied by 3M Corp. (Minneapolis, Minn.).

Figure 5:
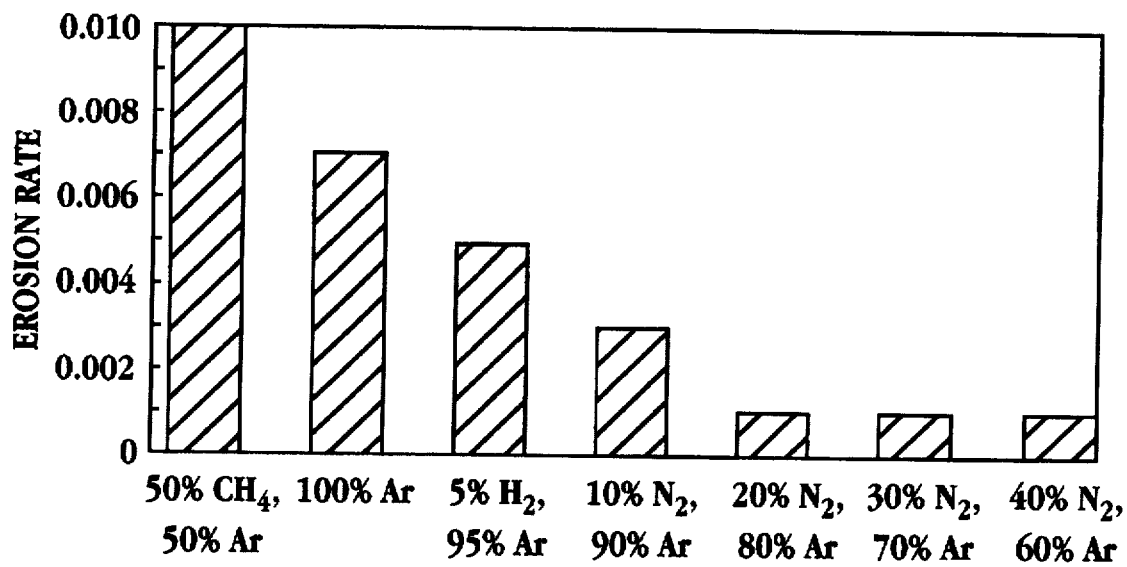
FIG. 5 is a bar graph showing the rate of erosion of a carbon overcoat formed by sputtering under a sputtering atmosphere having one of the compositions indicated in the plot.

Resistance to rate of erosion, expressed in mV of signal output related to changes in the reflectivity of the surface, was measured over a one minute time interval. Carbon films were prepared on a Canasite™ substrate to a final thickness of 300 Å under one of the following sputtering gas conditions: 50% CH$_4$/50% argon, 100% argon, 5% H$_2$/95% argon, 10% N$_2$/10% argon, 20% N$_2$/10% argon, 30% N$_2$/10% argon, and 40% N$_2$/10% argon. As seen from the wear resistance rates in FIG. 5, the best wear resistance was obtained for the films formed under 20–40 atomic percent nitrogen. The rate of erosion was several times lower than that achieved by conventional sputter deposition under a pure argon atmosphere, or an argon/methane atmosphere.

(iii) Auger Depth Profile

The concentrations of nitrogen, carbon, and cobalt on the surface and in the first several hundred angstroms of the overcoat surface layer were determined by Auger Electron Spectroscopy. Using this technique, the types of chemical bonds can be determined from the electron binding energy which is characteristic of bond type, such as C—C, C—O, C=O, or C—N. The relative amounts of atoms can be determined by the relative peak areas of the various emission peaks. A concentration depth profile of the overcoat is obtained by sputter etching with an argon ion gun the surface of the medium, removing the outermost layers. By alternating sputter etching with analysis a concentration depth profile is determined.

Figure 6:
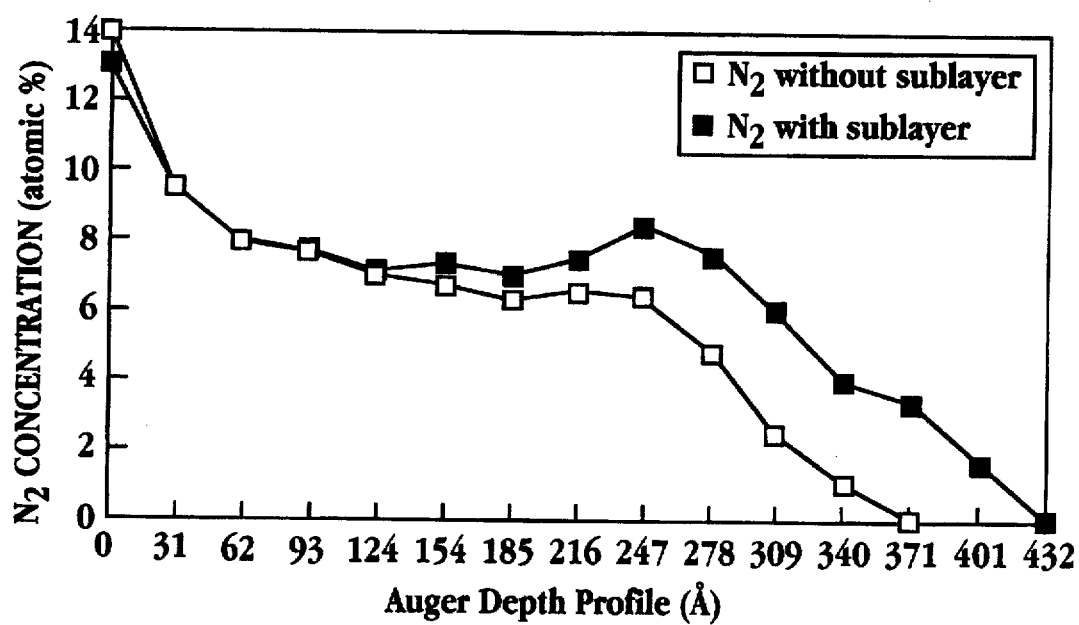
FIGS. 6 and 7 show concentration profiles as a function of depth for nitrogen (FIG. 6) and for cobalt (FIG. 7) for magnetic recording media formed with and without an overcoat sublayer.
Figure 7:
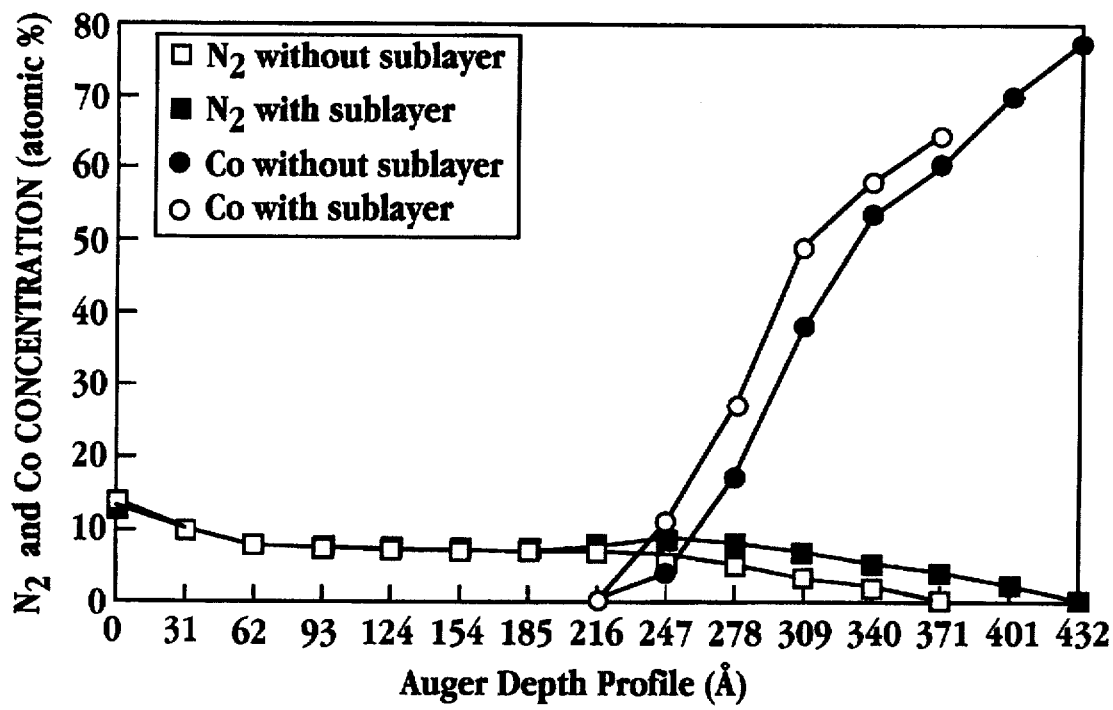

FIGS. 6 and 7 are Auger depth profiles for a magnetic recording medium formed in accordance with the invention, that is with an overcoat sublayer of carbon. This profile is compared to a medium formed without an overcoat sublayer. Both media have a nitrogen-containing overcoat and a cobalt-based thin-film recording layer.

FIG. 6 shows the concentration of nitrogen as a function of depth into the medium for media formed with (open rectangles) and without (solid rectangles) an overcoat sublayer. The surface of the media, that is the outermost surface of the nitrogen-containing carbon overcoat, have 13 and 14 atomic percent nitrogen. The nitrogen concentration as a function of depth for both media remains the same to a depth of about 154 Å. At depths greater than this, the nitrogen concentration is higher in the medium without an overcoat sublayer.

The profile shown in FIG. 6 indicates that the overcoat sublayer is effective to reduce the diffusion of nitrogen from the overcoat surface layer into the underlying layers. In these media, the thickness of the overcoat surface layer is approximately 80–150 Å. The medium with the overcoat sublayer has a 50 Å overcoat sublayer between the overcoat surface layer and the cobalt-based magnetic recording layer. Thus, the cobalt-based recording layer begins at a depth of approximately 200 Å. FIG. 6 shows that the nitrogen concentration is higher for the medium lacking the overcoat sublayer at depths greater than 200 Å, that is in the magnetic recording layer.

FIG. 7 shows the nitrogen and cobalt concentrations as a function of depth into the recording medium. Here, the medium formed with an overcoat sublayer is indicated by the open symbols and the medium without a sublayer by the filled symbols.

The initial nitrogen concentration at the surface of both media is approximately 13 atomic percent. At depths into the media of greater than about 220 Å, the media having an overcoat sublayer has less nitrogen (open rectangles), and at 371 Å the concentration of nitrogen was undetectable. However, for the medium without an overcoat sublayer, nitrogen was detected to a depth of between 400–430 Å, indicating that the overcoat sublayer is effective to reduce the diffusion of nitrogen.

Still with reference to FIG. 7, cobalt was first detected at depths of 216 Å in both media. The concentration of cobalt is higher for the media having an overcoat sublayer (open triangles), again indicating the sublayer is effective to reduce the diffusion of nitrogen from the overcoat surface layer into the magnetic recording layer.

Table 2 summarizes the concentrations of carbon, nitrogen, and cobalt as a function of depth into the recording media, as presented in FIGS. 6 and 7.

TABLE 2

AUGER DEPTH PROFILE OF NITROGEN-CONTAINING CARBON OVERCOAT SURFACE LAYER WITH AND WITHOUT A CARBON OVERCOAT LAYER

| Depth (Å) | Overcoat without Carbon Sublayer | | | Overcoat with Carbon Sublayer | | |
|---|---|---|---|---|---|---|
|  | C % | $N_2$ % | Co % | C % | $N_2$ % | Co % |
| 0 | 85 | 13 | 0 | 84 | 14 | 0 |
| 31 | 90 | 9.3 | 0 | 90 | 9.3 | 0 |
| 62 | 92 | 8.1 | 0 | 92 | 8 | 0 |
| 93 | 92 | 7.7 | 0 | 92 | 7.6 | 0 |
| 124 | 93 | 7.4 | 0 | 93 | 7.3 | 0 |
| 154 | 93 | 7.3 | 0 | 93 | 7 | 0 |

TABLE 2-continued

AUGER DEPTH PROFILE OF NITROGEN-CONTAINING CARBON OVERCOAT SURFACE LAYER WITH AND WITHOUT A CARBON OVERCOAT LAYER

| Depth | Overcoat without Carbon Sublayer | | | Overcoat with Carbon Sublayer | | |
|---|---|---|---|---|---|---|
| (Å) | C % | $N_2$ % | Co % | C % | $N_2$ % | Co % |
| 185 | 93 | 6.9 | 0 | 93 | 6.5 | 0 |
| 216 | 92 | 7.5 | 0 | 89 | 6.7 | 0 |
| 247 | 85 | 8.3 | 5.6 | 80 | 6.6 | 11 |
| 278 | 73 | 7.8 | 17 | 62 | 4.9 | 28 |
| 309 | 51 | 6.1 | 36 | 39 | 2.4 | 50 |
| 340 | 34 | 4 | 55 | 30 | 1 | 58 |
| 371 | 24 | 3.2 | 61 | 22 | 0 | 64 |
| 401 | 15 | 1.6 | 70 | — | — | — |
| 432 | 6.4 | 0 | 77 | — | — | — |

(iv) Magnetic Recording Properties

In one aspect, the medium of the invention includes an overcoat having a surface layer and a sublayer. The surface layer is a nitrogen-containing carbon film having a thickness between about 80–150 Å and the sublayer is an amorphous carbon layer, 25–100 Å in thickness.

The nitrogen-containing carbon surface layer gives improved wear-resistance to the medium, as shown above. The greater wear-resistance allows the thickness of the surface layer to be reduced, preferably in the 80–150 Å range, while retaining good wear resistance. The reduced thickness, by allowing the head to fly closer to the magnetic film layer in a recording medium, improves media performance in several ways.

Figure 8A:
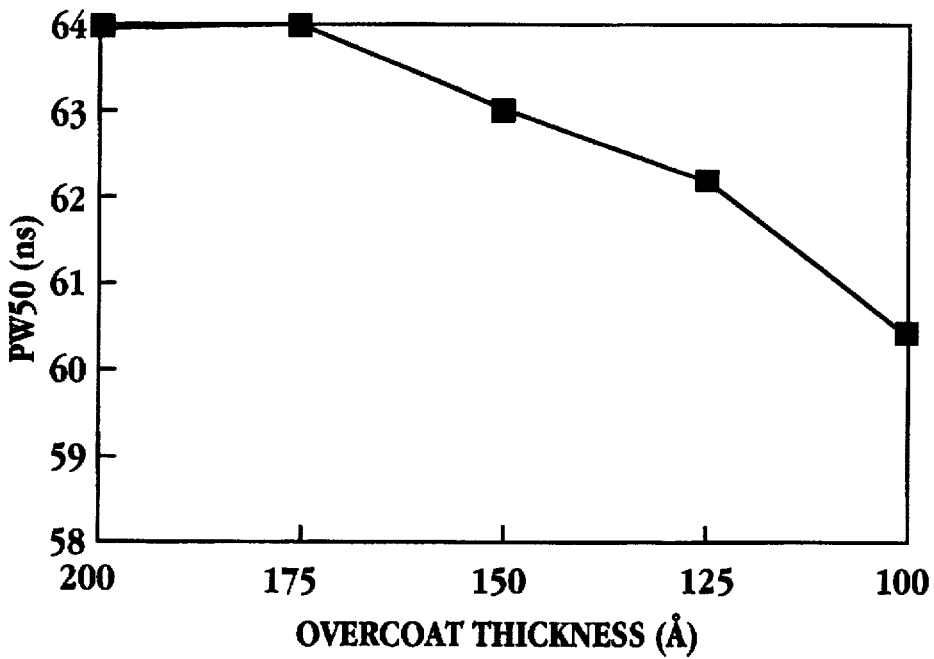
FIGS. 8A–8C are plots showing, as a function of nitrogen-containing carbon overcoat film thickness, $PW_{50}$ (FIG. 8A), overwrite (–db (FIG. 8B), and resolution (FIG. 8C)
Figure 8B:
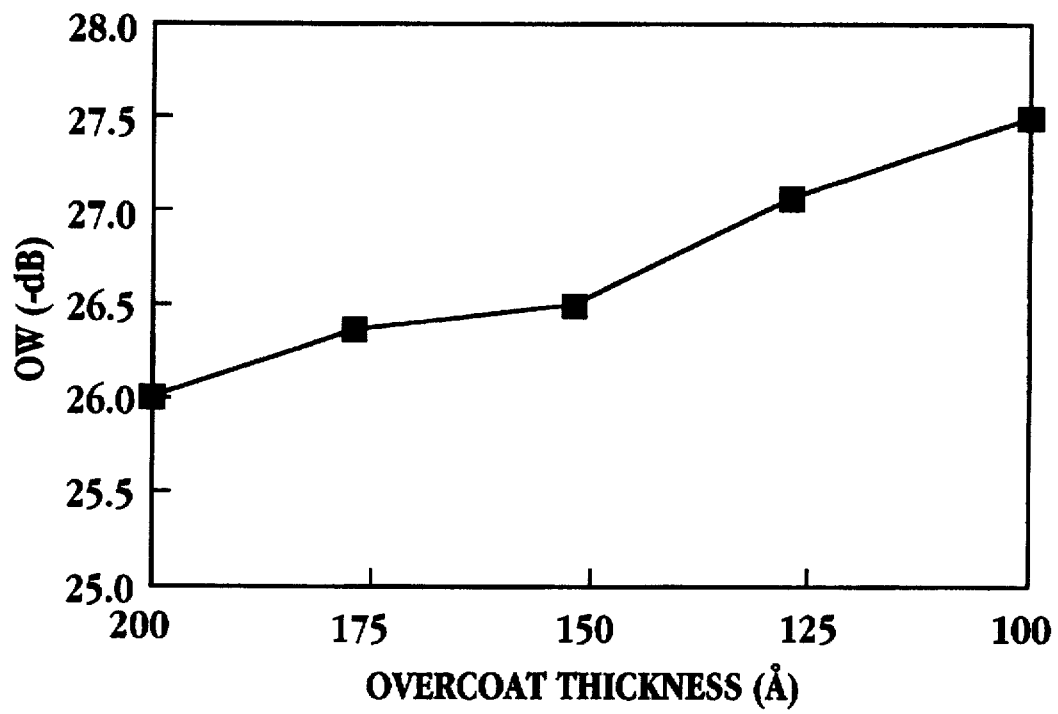
Figure 8C:
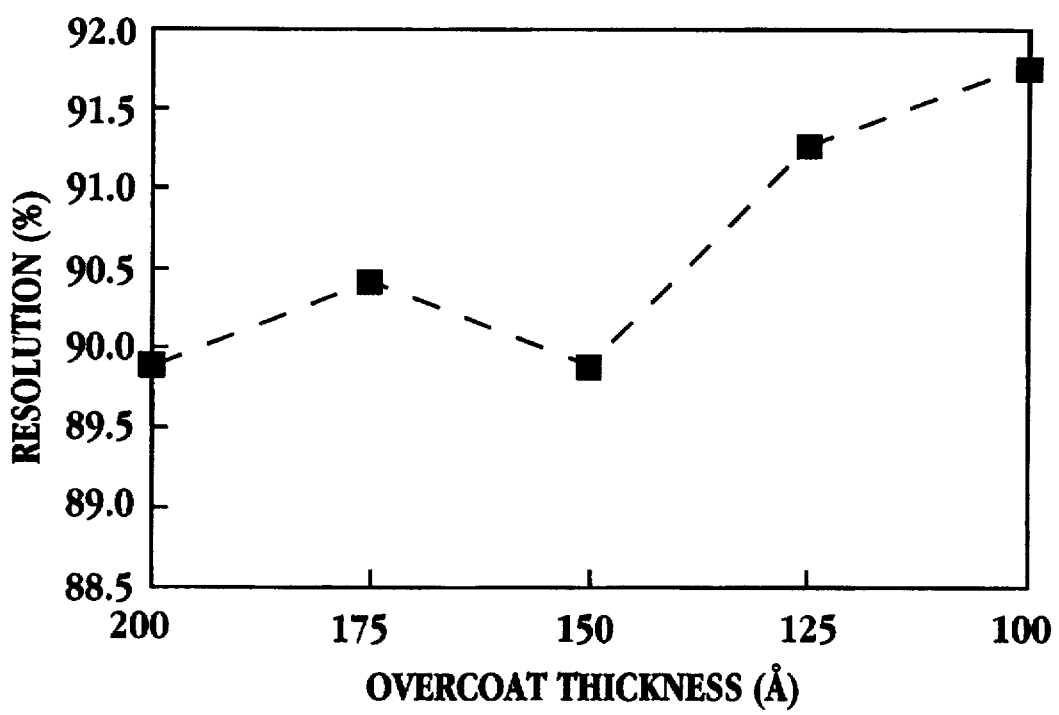

FIGS. 8A–8C show the improvement in various parameters in a thin-film medium formed on a nickel-phosphorus plated aluminum substrate, and having a chromium underlayer and a Co/Cr/Ta (88:8:4) magnetic layer. The final carbon overlayer was formed by sputtering from a graphite target under an 80% argon/20% nitrogen atmosphere.

Magnetic recording testing was carried out on a Guzik Model RWA 501, using a thin-film inductive reading and recording head with a gap length of 0.26 μin., and a flying height of 3.0 μin. The head inductance was 1.5 μHenry and resistance, 1 ohm/turn. Recording current was 12 mAmps for saturation. The ID measurements were made at 0.985 inches, at a recording frequency of 6.92 Mhz.

The isolated readback pulse width, PW-50, measured at 50% of base to peak amplitude, indicates the degree of signal distortion at a given readback frequency due to overlap between adjacent signals. Ideally, for high density recording, PW-50 should be reduced. The plot in FIG. 8A shows a significant reduction in $PW_{50}$ as the thickness of the nitrogen-containing overcoat is reduced from 175 to 100 Å.

Overwrite (measured in –db) is a measure of the overbias required to completely erase a lower frequency signal with a higher frequency one. The plot in FIG. 8B shows improved overwrite properties as the thickness of the nitrogen-containing overcoat surface layer is reduced from 175 to 100 Å.

Resolution provides a measure of the response of a read/write system. Resolution is typically expressed as a ratio (in percent) between the read voltages at high frequency and low frequency. The plot in FIG. 8C shows improved resolution in the medium as the thickness of the nitrogen-containing overcoat is reduced from 175 to 100 Å.

As shown above in Section IV(iii), the overcoat sublayer in the magnetic recording medium is effective to reduce the amount of nitrogen that diffuses from the overcoat surface layer to the magnetic recording layer. Nitrogen present in the magnetic recording layer effects the magnetic recording properties. This effect is shown in Tables 3 and 4 where the magnetic recording properties of media formed with and without an overcoat sublayer are summarized.

Table 3 shows the coercivity, squareness ratio (SR), switching field distribution, coercive squareness (S*), magnetic remanence (Mrt), and magnetic field difference (Delta H) for media formed with and without an overcoat sublayer. The most noticeable difference between the two media is in the coercivity, where the medium formed with a sublayer has a 17% higher coercivity than the medium formed without a sublayer.

TABLE 3

MAGNETIC PROPERTIES OF MEDIA FORMED WITH AND WITHOUT AN OVERCOAT SUBLAYER

| | Coercivity (Oe) | SR | SFD | S* | Mrt (Gμ) | Delta H (Oe) |
|---|---|---|---|---|---|---|
| with sublayer | 1899 | 0.87 | 0.24 | 0.82 | 329 | 453 |
| without sublayer | 1623 | 0.89 | 0.20 | 0.83 | 343 | 326 |

Table 4 shows the parametrics at the inner and outer disc diameters for media formed with and without an amorphous carbon overcoat sublayer. In general, better recording performance is achieved with media having a higher resolution (Res), a smaller pulse width ($PW_{50}$), a lower bit shift (BS). The medium formed with an overcoat sublayer has a higher resolution and lower pulse width and bit shift at both the inner and outer disc diameters than the medium formed with no overcoat sublayer.

TABLE 4

PARAMETRICS OF MEDIA FORMED WITH AND WITHOUT AN OVERCOAT SUBLAYER

| | Inner Diameter | | | Outer Diameter | | |
|---|---|---|---|---|---|---|
| | Res. (%) | $PW_{50}$ (ns) | BS (ns) | Res. (%) | $PW_{50}$ (ns) | BS (ns) |
| with sublayer | 85.27 | 49.74 | 7.57 | 88.31 | 30.64 | 3.51 |
| without sublayer | 83.03 | 51.19 | 8.26 | 88.18 | 31.16 | 3.39 |

(v) Contact Start-Stop Properties

CSS (contact-start-stop) testing is an important test for the hard disk drive performance. For advanced near-contact recording, the disks must have low stiction and friction at different humidity environments during the CSS test.

FIGS. 9A–9E shows the results of in-situ wet stiction/friction tests for 95 mm disks with hydrogen- and nitrogen-containing carbon overcoats at different thicknesses. In this test, the temperature was constant at 30° C. while the relative humidity (R.H.) was increased from 35% to 90% at 5% increments and then the humidity was stepped down to 35%. At each humidity step, there are 50 CSS cycles. Thin film heads with 6.5 gram load were used for testing on 95 mm disks at radius of 21.6 mm.

Figure 9A:
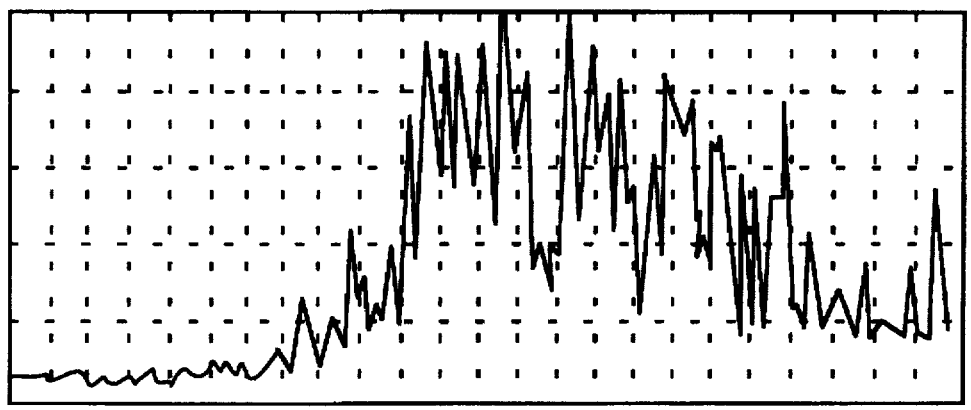
FIGS. 9A–9E show the results of in-situ wet stiction/friction tests on carbon overcoats sputtered in the presence of 60% argon/40% nitrogen for film thicknesses of (FIG. 9B), (FIG. 9C), (FIG. 9D), and 100 Å (FIG. 9E).
Figure 9B:
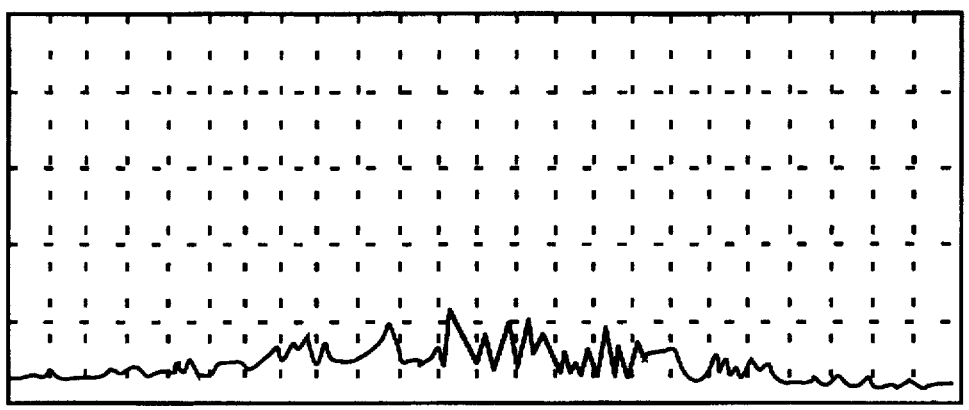
Figure 9C:
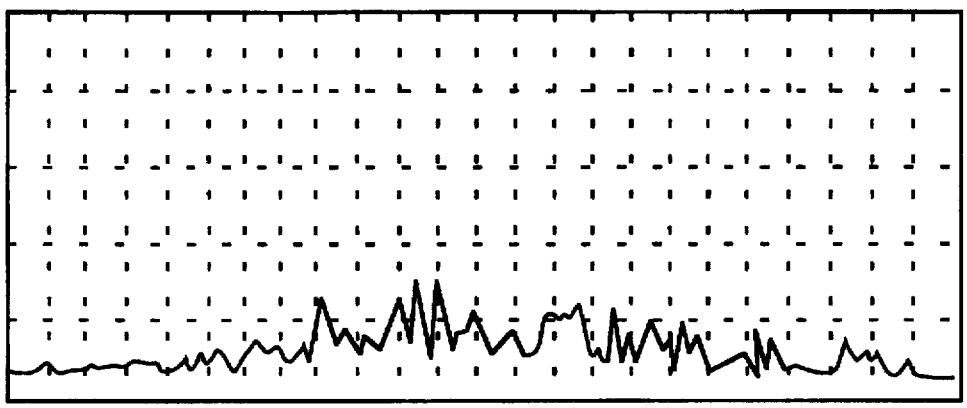
Figure 9D:
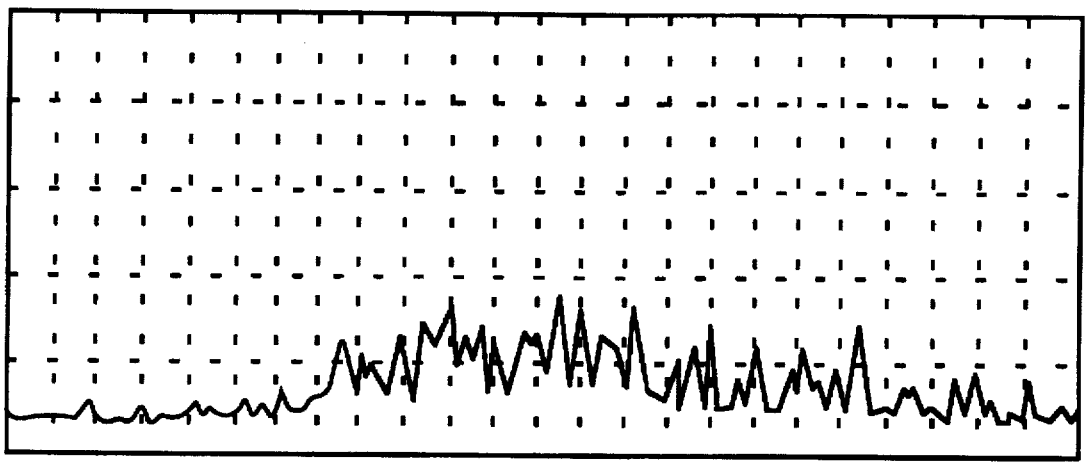
Figure 9E:
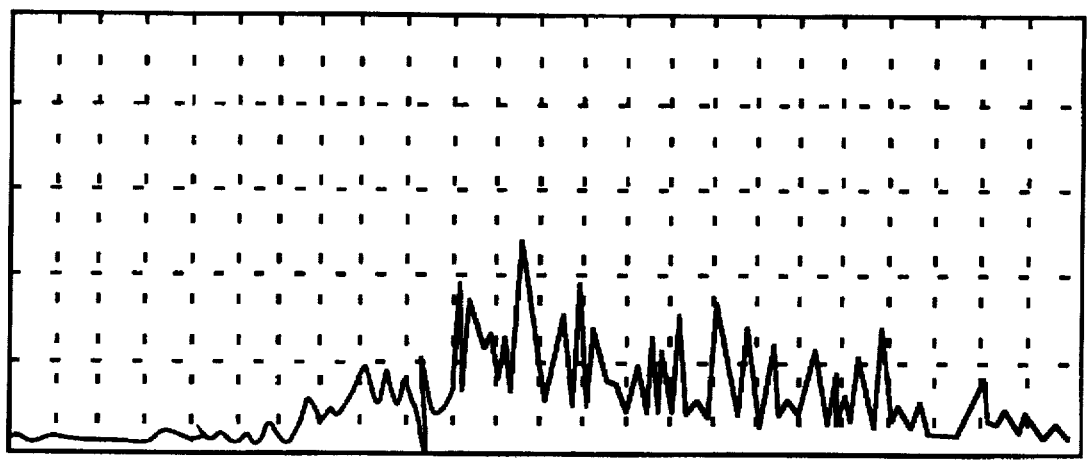

Media having a hydrogen-containing overcoat surface layer were sputtered under an atmosphere of 50% argon/50% methane to a thickness of 250 Å. FIG. 9A shows the CSS results of this medium.

Nitrogen-containing carbon overcoat surface layers were sputtered with 60% argon/40% nitrogen to thicknesses of 200 Å, 150 Å, 125 Å and 100 Å and the CSS results are shown in FIGS. 9B, 9C, 9D, and 9E, respectively. FIG. 9A indicates that a hydrogenated carbon overcoat has a higher stiction and friction, and is more sensitive to the wet humidity. FIGS. 9B–9E show that nitrogen-containing carbon films have excellent CSS performance, even at thicknesses as thin as 100 Å.

From the foregoing, it will be appreciated how various objects and features of the invention are met. A carbon overcoat containing nitrogen has significantly greater resistance to wear than sputtered carbon films formed under pure inert gas. A sublayer formed between the nitrogen-containing overcoat surface layer and the magnetic recording layer is effective to reduce the diffusion of nitrogen into the magnetic recording layer. This is important, as nitrogen present in the cobalt-based recording layer effects the magnetic recording properties. Media formed with an overcoat sublayer have a higher coercivity and resolution, and a lower bit shift and pulse width than media formed without an overcoat sublayer.

Formation of the nitrogen-containing or hydrogen-containing overcoat surface layer with a sputtering target bonded to the target electrode by means of an electrically conductive, thermally conductive coating is effective to reduce arcing between the target and the disc.

Although the invention has been described with respect to particular embodiments, it will be apparent to those skilled in the art that various changes and modifications can be made without departing from the invention.

It is claimed:

1. In a thin-film medium having a substrate, a magnetic thin-film layer, and a sputtered, nitrogen-containing, wear-resistant overcoat on the layer, an improvement comprising:

(a) a sputtered, non-magnetic, substantially nitrogen-free sublayer disposed between said overcoat and said magnetic layer and having a thickness between 25–100 Å.

2. The medium of claim 1, wherein said sublayer is composed of a sputtered material selected from the group consisting of carbon, chromium and titanium.

3. The medium of claim 1, wherein said sublayer is between 25–50 Å in thickness and is composed of carbon.

4. The medium of claim 1, which has a coercivity at least 15% higher than the same medium in the absence of said sublayer.

5. The medium of claim 1, wherein said overcoat is formed by sputtering from a graphite target under an atmosphere consisting essentially of 60–80 atomic percent argon and 20–40 atomic percent nitrogen.

6. In a method of producing a carbon overcoat in a thin-film magnetic recording medium having a magnetic recording layer, where said overcoat is produced by sputtering a nitrogen-containing carbon surface layer from a graphite target under an atmosphere composed of 60–80 atomic percent argon and 20–40 atomic percent nitrogen, an improvement, comprising sputtering a non-magnetic, substantially nitrogen-free sublayer to a thickness between 25–100 Å prior to sputtering the carbon surface layer.

7. The method of claim 6, wherein said sublayer sputtering is from a target material selected from the group consisting of carbon, chromium, and titanium.

8. The method of claim 6, wherein said sublayer sputtering is from a graphite target and is effective to deposit a layer between 25–100 Å in thickness.

9. The method of claim 7, wherein the graphite target is bonded to a stainless steel cathode cap by means of (i) an electrically conductive, thermally conductive coating formed on each of the confronting surfaces of said target and cathode cap, and (ii) a solder effective to bond to said coatings and which has a melting temperature above 150° C.

10. A method of forming a sputtered hydrogen or nitrogen containing layer on a disc, comprising placing the disc in the target-deposition region of a graphite target that is bonded to a stainless steel cathode cap by means of (i) an electrically conductive, thermally conductive coating formed on each of the confronting surfaces of said target and cathode cap, and (ii) a solder effective to bond said coatings and which has a melting temperature above 150° C.; and sputtering graphite from the target onto the disc under a hydrogen or nitrogen containing atmosphere.

11. The method of claim 10, wherein said coatings are formed of a metal selected from the group consisting of copper, silver and gold.

12. The method of claim 10, wherein said coatings are copper and have a thickness between 0.2–10 μm.

* * * * *